United States Patent [19]

Kawahara et al.

[11] Patent Number: 4,772,922
[45] Date of Patent: Sep. 20, 1988

[54] COPYING APPARATUS

[75] Inventors: Hiroshi Kawahara, Nishikasugai; Jun Sakai, Nagoya; Masanori Kobayashi, Ichinomiya, all of Japan

[73] Assignee: Brother Kogyo Kabushiki Kaisha, Aichi, Japan

[21] Appl. No.: 32,865

[22] Filed: Mar. 31, 1987

[30] Foreign Application Priority Data

Apr. 1, 1986 [JP] Japan .................................. 61-76281
Jul. 31, 1986 [JP] Japan ................................ 61-181270

[51] Int. Cl.$^4$ ....................... G03B 27/32; G03B 27/52
[52] U.S. Cl. .......................................... 355/32; 355/4; 355/16
[58] Field of Search ......................... 355/4, 8, 5, 11, 16, 355/44, 45, 71, 77

[56] References Cited

U.S. PATENT DOCUMENTS 3,260,153 7/1966 Abbott, Jr. et al. ................. 355/454

Primary Examiner—Richard A. Wintercorn
Attorney, Agent, or Firm—Kane, Dalsimer, Sullivan, Kurucz, Levy, Eisele and Richard

[57] ABSTRACT

Copying apparatus is constituted by a photosensitive member having a photochromic characteristic when changes light transmitibility when projected with light reflected by a manuscript. A light source is provided for projecting a photo-image formed on the photosensitive member onto a photosensitive recording sheet through the photosensitive member. In a modified embodiment, the copying apparatus has a construction substantially the same as the conventional electrophotographic copying machine except that a photosensitive drum is made of transparent material and covered by a thin transparent photoconductor. Consequently a toner image corresponding to the photo-image of a manuscript is formed on the photosensitive drum. A light source is provided for projecting the toner image on a photosensitive recording sheet.

19 Claims, 3 Drawing Sheets

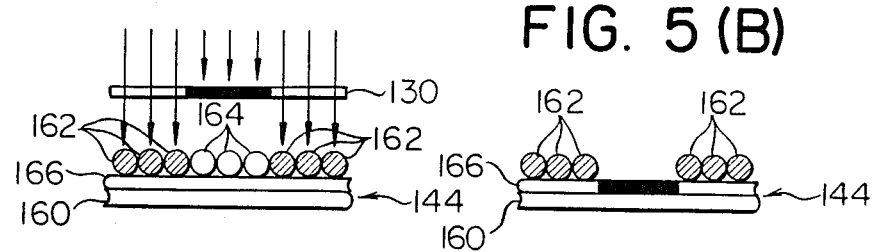
FIG. 5(A)
FIG. 5(B)
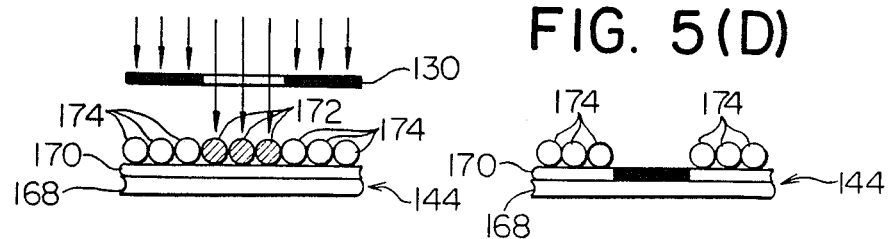
FIG. 5(C)
FIG. 5(D)
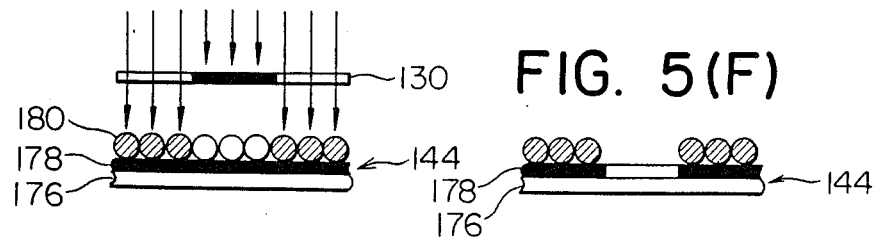
FIG. 5(E)
FIG. 5(F)
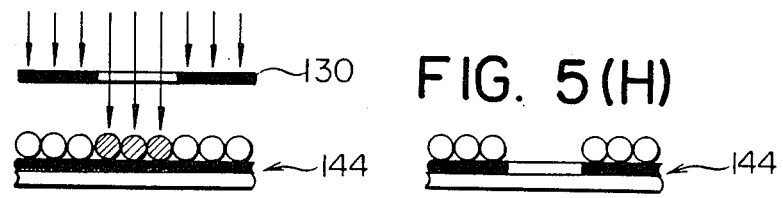
FIG. 5(G)
FIG. 5(H)

COPYING APPARATUS

BACKGROUND OF THE INVENTION

This invention relates to a copying apparatus utilizing a photo-sensitive recording sheet.

In a copying apparatus utilizing a photo-sensitive recording sheet, adopted are (1) an indirect exposure system in which the recording sheet is exposed to light reflected by a manuscript and (2) a direct exposure system such as a diazo copying machine in which the recording sheet exposed to light which the recording sheet is superposed on a transparent sheet shaped manuscript. With the above system (1), since a sufficiently large light quantity, that is a luminous energy, is necessary to transfer a photo-image on the recording sheet it is necessary to use a large light source, hence a large power source, whereas with system (2) it is impossible to copy a manuscript in the form of a book.

In the past, copying of a thick manuscript or a book was made by means of an electrophotographic copying machine. In such copying machine a photo image of the manuscript is projected on an electrically charged photoconductor through a suitable optical system, portions of the photoconductor are applied with a toner usually consisting of a colored resin powder, the deposited toner is transferred on a copying paper and then fixed by heat.

In such prior art electrophotographic copying machine, it is necessary to supplement the toner periodically so that it is necessary to always store such consumptive materials as the copying paper and the toner.

SUMMARY OF THE INVENTION

It is an object of this invention to provide a novel copying apparatus capable of reducing the capacity of the light source and the power source which can copy manuscripts in the form of a book.

Another object of this invention is to provide a novel copying apparatus which does not use a toner.

According to this invention there is provided a copying apparatus utilizing a photosensitive recording sheet, which comprises a photosensitive member; means for forming a light shielded area on said member corresponding to an image of a manuscript; exposrre means for exposing said photosensitive recording sheet through said member; and means for removing said light shielded area from said member.

According to a modification of this invention, there is provided a copying apparatus utilizing a photo-sensitive recording sheet, comprising a photosensitive member having a photochromic characteristic that changes its light transmissibility when projected with a photo image of a manuscript; an exposure lamp emitting light having a wavelength not sensed by the photosensitive member and utilized to expose the recording sheet through the photosensitive member, and erasure means for erasing an image formed on the photosensitive member.

According to a further modification of this invention, there is provided a copying apparatus comprising a transparent photosensitive member; a first light source emitting light sensible by the photosensitive member; first exposure means for forming an image of a manuscript on the transparent photosensitive member by using the light emitted by the first light source; means for coating light shielding substance on the exposed photosensitive member corresponding to the image of the manuscript; a second light source emitting light not sensed by the transparent photosensitive member; second exposure means for projecting the light of the second light source on a photosensitive recording sheet through the transparent photosensitive member coated with the light shielding substance; and means for fixing an image on said photosensitive recording sheet.

BRIEF DESCRIPTION OF THE ACCOMPANYING DRAWINGS

FIGS. 5(A) through 5(H) are sectional views showing the construction of the recording sheet and steps of development and fixing an image thereon.

DESCRIPTION OF THE PREFERRED EMBODIMENTS

Figure 1:
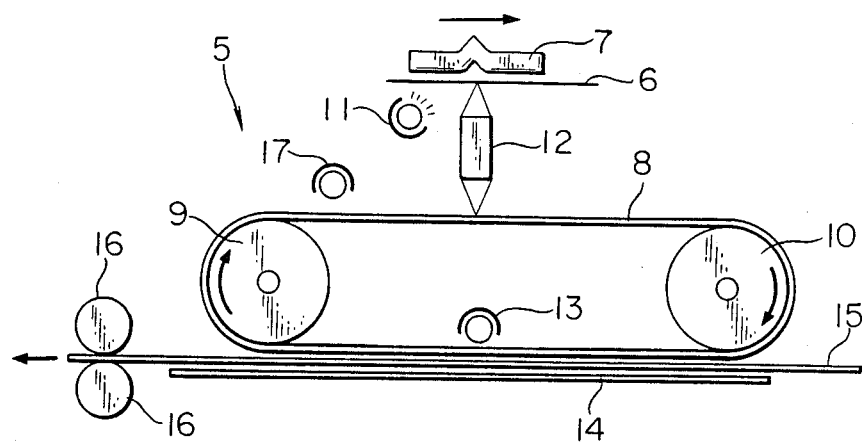
FIG. 1 is a diagrammatic side view showing an embodiment of the copying apparatus according to this invention.

In the first embodiment shown in FIG. 1, a manuscript 7 is mounted on a manuscript support 6 of the copying apparatus of this invention. Beneath the manuscript support 6 is located on endless photosensitive belt 8 having a photochromic characteristic and passing about two spaced drums 9 and 10 to rotate in the clockwise direction. A first light source 11 is located beneath the manuscript support 6 to illuminate the manuscript 7. The light reflected by the manuscript is focused on the photosensitive belt 8 through a condenser lens 12 (a dot lens assemble). The manuscript support 6 is movable to the right as viewed in FIG. 1 in synchronism with the photosensitive belt 8. The wavelength of the light emitted by the first light source 11 is selected to be the same as the wavelength sensible by the photosensitive belt 8.

A second light source 13 is located at the opposite side of the photosensitive belt 8 with respect to an exposure platform 14, and a photo and pressure sensitive recording sheet 15 is moved on the exposure platform 14 in syncronism with the photosensitive belt 8. The wavelength of the light emitted by the second light source 13 does not coincide with the wavelength sensible by the photo and pressure sensible recording sheet 15. A pressure developing device 16 is constituted by a pair of opposing rollers which apply a pressure for developing the photo and pressure sensitive recording sheet exposed to the light from the second light source 13. An erasing device 17 comprising a lamp is located above the upper path of the photosensitive belt 8.

In operation, the light emitted by the first light source 11 is reflected by the manuscript 7 and then focused on the photosensitive belt 8 having a photochromic characteristic by the condenser lens 12. The term "photochromic characteristic" means a photo-reversible change between structures A and B of a substance, the photo-reversible change accompanying change at absorptive spectrum that is color. Change from structure B to structure A is done by shielding a light and accelerated by applying such external energy as heat or light having different wavelength.

When the photo image of the reflected light is focused on the photosensitive belt 8 having a characteristic which changes form a colored state in the structure A to a transparent and colorless state in the structure B, the light portion of the manuscrit becomes a colorless transparent state on the photosensitive belt, whereas the black portion of the manuscript remain in a colored state on the photosensitive belt, so that an image of the manuscript is formed on the photosensitive belt 8. Thereafter, as the photosensitive belt 8 is moved, the photo and pressure sensitive recording sheet 15 underlying the belt 8 is exposed to the light from the second light source 13 thereby forming a latent image on the recording sheet 15. As it is moved to the left, it is pressed and developed by the pressure developing device 16. As the photosensitive belt 8 is moved further, it is supplied with such external energy as heat or light having a different wavelength by the erasure device 17 to restore the original structure A thereby erasing the image formed on the belt 8.

Without operating the erasure device 17, where a new recording sheet 15 moved together with the belt 8, a plurality of copies can be obtained by one exposure of the manuscript 7.

In this embodiment, since the recording sheet 15 is exposed to the light from the second light source 13 while being superposed by the photosensitive belt 8, the second light source 13 may by a relatively small one. Furthermore, as the image on the photosensitive belt 8 is formed by the light reflected by the manuscript 7, the manuscript in the form of a book can readily be formed.

Figure 2:
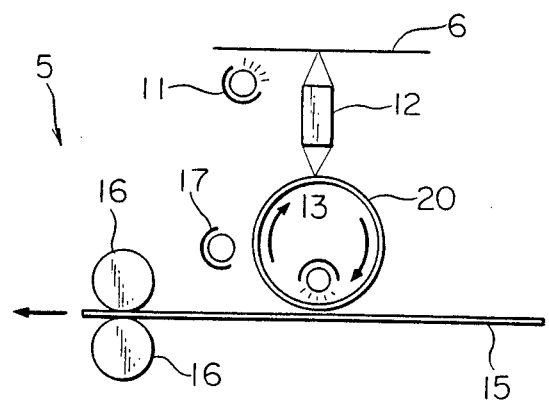
FIGS. 2 and 3 are similar views showing other embodiments of this invention.

FIG. 2 shows a second embodiment of this invention which is different from the first embodiment only in that a photosensitive drum 20 is used instead of the photosensitive belt 8.

The photosensitive belt 8 and drum 20 used in the foregoing embodiments illustrated in FIGS. 1 and 2 are made of thionic compounds (thionine, methylene blue, AzurC and AzurB) so that they may be made of any photochromic substance so long as it is in a colorless and transparent state in the structure A but changes to a colored state in the structure B when exposed to light. Examples of inorganic compounds are AgX (X: a halogen), HgSi and ZnS, while examples of organic compounds are spiropyrone, triphenylmethane, pyologen, diazometal and guinone compounds. In any case, the compound is dissolved or dispersed in such high-molecular-weight transparent resin as polyetylen, polymethyl metacrylate, polyacrylnitrile, polyvinylalcohole, polyethylene terephthalate, polyvinyl buthylate, etc, and the resulting mixture is molded into a photosensitive belt or drum. The organic photochromic substance can be converted into a high-molecular-weight material utilized to prepare a belt or drum.

Figure 3:
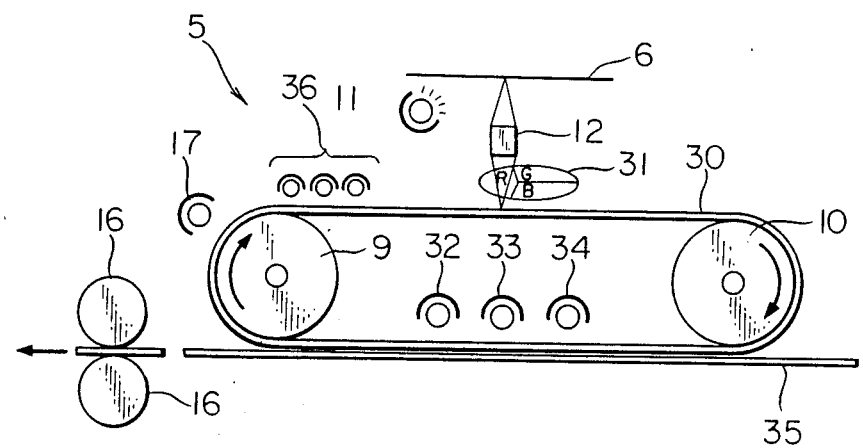

FIG. 3 shows a third embodiment of this invention as applied to a color copying machine in which the same or corresponding elements as those of the foregoing embodiments are designated by the same reference numerals. In FIG. 3, a belt shaped photosensitive member 30 is constituted by a mixture of a photochromic substance R which is a cyan color state in the structure A but becomes a colorless transparent state in the structure B when exposed to red color light, a photochromic substance G which changes from magenta to a colorless transparent state when exposed to green color light, and a photochromic substance Y which changes from yellow to a colorless transparent state upon exposure to blue color light. A color analyzing filter 31 is disposed between a condenser lens 12 and the belt 30, while a yellow exposure lamp 32, a magenta exposure lamp 33 and a cyan exposure lamp 34 are disposed inside the upper and lower paths of the belt shaped member 30 to oppose the photo and pressure sensitive recording sheet 35 through the belt 30. A decolorizing device 36 is constituted by three types of lamps corresponding to three types of photochromic substances R, G and Y.

In this embodiment, the light emitted by the first light source 11 is reflected by a color manuscript, color-analyzed by the color analyzing filter 31 after passing through the condenser lens 12 and then focused on the belt 30. When the color analyzing filter 31 is set to red color and the photochromic substances G and Y are converted into the colorless transparent state by the decolorizing device 36, only the photochromic substance R in the colored state remains on the belt shaped photosensitive member 30. Under this state, the belt 30 is partially exposed to red color with the result that the image of red color of the manuscript 7 is formed on the belt 30.

Then as the belt 30 is moved, the cyan exposure lamp 34 is lighted so as to expose the color recording sheet 35 through the belt 30, thus completing an exposure corresponding to red light. Then the belt 30 is restored to its initial state (colored state) be the erasure device 17.

In the same manner, where the color analyzing filter 31 is set to green color, by the operation of the decolorizing device 36 the photochromic substance G in the colored state is left on the belt shaped photosensitive member 30. When the color analyzing filter 31 is set to blue color, the photochromic substance Y in the colored state is left so that the same portion of the recording sheet 35 is exposed by the yellow exposure lamp 32 through the belt shaped photosensitive member 30. After completing three exposures described above the recording sheet 35 is developed by the pressure applied by the pressure developing device 16, thereby completing color copying on the recording sheet 35.

As above described, the copying apparatus of this invention comprises a photosensitive member having a photochromic characteristic which changes its light transmissibility when projected with a photo image of a manuscript, an exposure lamp emitting light having a wavelength not sensed by the photosensitive member and utilized to expose the photo and pressure sensitive recording sheet through the photosensitive member and an erasure device for erasing a photo image formed on the photosensitive member so that it is not only possible to decrease the capacities of the light source and the power source but als possible to readily copy a manuscript in the form of a book.

Figure 4:
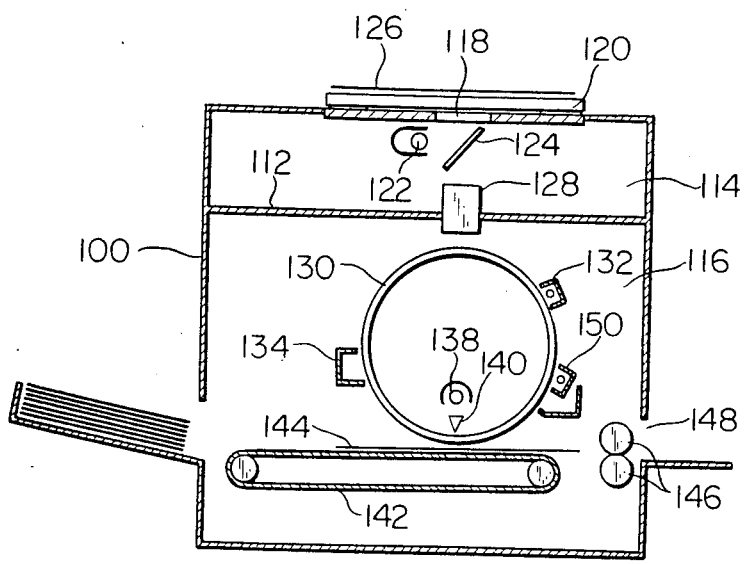
FIGS. 4 is a diagrammatic representation showing another embodiment of this invention.

Another embodiment shown in FIG. 4 comprises a casing 100 partitioned into a first exposure chamber 114 and a second exposure chamber 116 by a partition plate 112. A portion of the upper surface of the manuscript support 120 also made of a glass sheet and movable in the horizontal direction.

In the first exposure chamber 114, are contained a light source 122 and a half mirror 124 which reflects the light emitted by the light source 122 onto a manuscript 126 mounted on a manuscript support 120 through glass sheet 118.

The light reflected by the manuscript 126 passes through glass sheets 118 and 120, half mirror 124 and through an optical system 128 extending through partition plate 112 and focused on the surface of a rotatable photosensitive drum 130 in the second exposure compartment 116.

The photosensitive drum 130 comprises a transparent drum made of glass or the like and thin transparent photoconductor coated on the surface of the drum 30 and having a photosensitivity in a visible light range. More particularly, the laminated photoconductor comprises a lower layer acting as a charge generating layer made of an

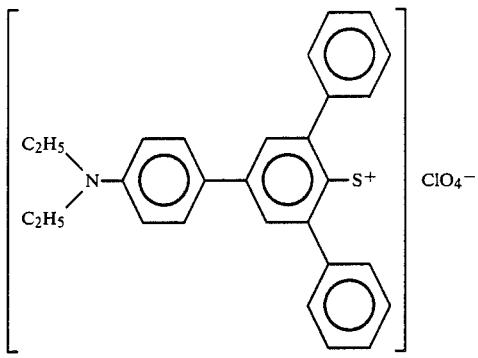

and a polycarbonate, and a lower layer acting as a charge transfer layer made of a compound having a construction

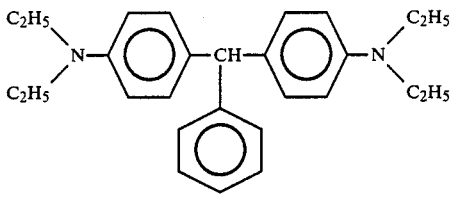

which is known to have the desired characteristic.

Before exposed by the light source 122, the surface of the photosensitive drum 130 is electrostatically charged by a charging device 132. While rotated in the counter clockwise direction as viewed in FIG. 4 the charge on only the portions of the photosensitive drum 130 exposed to the light from the first light source 122 is discharged so that an electrostatically applied only to portions which retain the charge by a toner applicator 134. When the portion of the photosensitive drum 30 applied with the toner reaches the lowermost position, the light emitted by a second light source 138 installed in the photosensitive drum 130 is projected onto a photosensitive recording sheet 144 clamped between the drum 130 and a conveyor belt 142 through a condenser prism 140. The second light source 138 has a wavelength not sensible by the photoconductor on the photosensitive drum 30, that is when the photoconductor described above is used, the light is an ultraviolet light.

The photosensitive recording sheet 144 exposed to the light from the second light source 138 is conveyed to the right an viewed in FIG. 4 by the sheet conveyor 142 and pressed between a pair of pressure rollers 146 to be developed and fixed. Then, the fixed photosensitive recording sheet 144 is sent out through a copy discharge window 148. The toner and the charge remaining on the photosensitive drum 130 are removed by a cleaner 150. After charging by the charging device 132 and applied with the toner by the toner applicator 134, the photosensitive drum 130 can be used again.

The developing and fixing treatment of the photosensitive recording sheet 144 used in the copying machine described above will now be described as follows. The photosensitive recording sheet 144 is constituted by a sheet and microcapsules mounted thereon.

In an example shown in FIGS. 5(A) and 5(B), a paper sheet 160 is used as the supporting sheet, and essential components sealed in the microcapsules consist of a dye precursor (for example, Triarylmethane compound), a photo-curable resin (for example, photopolymerized resin such as Trimethylpropane) and a photo-polimering initiator (for example, Benzophenene). The essential component coated on the paper sheet 160 consists of such chromogenic material which react, with the dye precursor to develop color as an organic acid or the like. Such recording sheet is described in the U.S. patent specification No. 4,440,846, for example. With this construction, as illustrated in FIG. 5(A), microcapsules at a portion of the photosensitive recording sheet irradiated with light harden whereas the microcapsules at a portion not irradiated by light maintain their original softness. Thereafter, when pressed by pressure rollers 146, only microcapsules remaining in the soft state are ruptured as illustrated in FIG. 5(B) so that the dye precursor enveloped in the microcapsules 164 reacts with the chromogenic material 166 coated on the paper sheet 160, thereby forming a color copy image of the same color as the manuscript 126 on the paper sheet 160. Since hardened microcapsules 162 would not be ruptured, fixing of the developed image is possible. Aothough in this embodiment, the chromogenic material is coated on the paper sheet 160, the material may be coated on a separate developing paper as disclosed in the U.S. patent specification No. 4,399,209.

In another example shown in FIGS. 5(C) and 5(D), a transparent film 168 is used as the supporting member and in the microcapsules are enveloped a dye precursor and a photo-softenable resin (for example, 3-oxyamino-2-buthanone methacrylate) while a chromogenic material 170 is coated on the film 168. With this construction, only the microcapsules 172 at positions irradiated by light soften, whereas microcapsules at positions not irradiated with light maintain their original hard state. Consequently, by the pressure applied by the pressure rollers 146 only the softened microcapsules are ruptured so that only the portion of the film 168 is colored. In this case, a copied image of the phase opposite to that of the photosensitive drum 130 is obtained, thereby effecting negative to positive conversion of the image.

A further embodiment shown in FIGS. 5(E) and 5(F) has a construction similar to the embodiment illustrated in FIGS. 5(A) and 5(B), but instead of coating a chromogenic material on the paper sheet 176, a layer 178 colored by a dye is applied onto the paper sheet 176, and instead of a dye precursor such decoloring agent as a bleaching agent is enveloped in microcapsules 180. In this case, only the portion not irradiated with light is decolorized thus obtaining a copy of a phase opposite to that of the manuscript.

In another embodiment illustrated in FIGS. 5(G) and 5(H), a dye precursor, a chromogenic material and a dye and a decolorizing agent similar to those used in FIGS. 5(C) and 5(D) are exchanged each other to obtain a copy image of the same phase.

As above described, the copying apparatus of this invention is not necessary to use any exhaustive material other than the recording sheet and it is possible to readily produce copies of the same or opposite phase by using various types of the recording sheets suitable for the field of use. Furthermore, it is possible to continuously form a plurality of copies by continuously rotating the photosensitive drum 130 without removing the toner 136 with the toner remover 150 and by irradiating a next recording sheet 144 with light from the second light source 138.

Although in the foregoing embodiments the microcapsules on the photosensitive recording sheet irradiated by light are ruptured by the pressure applied by pressure rollers, the microcapsules can also be prepared to be ruptured by such means other than mechanical means as thermal, electrical, physical or chemical means. For example, a substance swollen by heat may be sealed in the microcapsules. The microcapsules can be ruptured by electric discharge or their shells can be made of materials that can by dessolved physically or chemically.

Since the copying apparatus of this invention does not require any exhaustive material other than the recording sheet, its operation and maintenance are more convenient than prior art copying apparatus.

What is claimed is:

1. A copying apparatus for forming copies on a photosensitive recording medium comprising:
   a photosensitive member sensitve to light of a first wavelength;
   means for forming a light shielded area on said member corresponding to a subject image to be copied;
   exposure means for exposing said recording medium through said photosensitive member, said exposure means emitting light of a second wavelength which differs from said first wavelength and to which said photosensitive member is not sensitive and said recording medium is sensitive; and,
   means for removing said light shielded area from said photosensitive member.

2. The copying apparatus according to claim 1 wherein said photosensitive member has a photochromic characteristic, and said means for forming a light shielded area comprises means for projecting a photo-image of a manuscript onto said member.

3. The copying apparatus according to claim 1 wherein said photosensitive member is transparent and has a photo-conductive characteristic, and said means for forming a light shielded area comprises exposure means for forming a latent image of a manuscript on said member and means for coating a light shielding substance on said member corresponding to the latent mage of the manuscript.

4. A copying apparatus utilizing a photosensitive recording medium, comprising:
   a photosensitive member having a photochromic characteristic that changes its light transmissibility when projected with a photo-image of a subject image to be copied;
   means for projecting a photo-image of a subject image to be copied onto said photosensitive member;
   an exposure lamp emitting light having a wavelength which does not coincide with the length sensible by said photosensitive member but does coincide with the wavelength sensible by said photosensitive recording medium utilized to expose said photosensitive recording medium through said photosensitive member; and
   eraser means for erasing an image formed on said photosensitive member.

5. The copying apparatus according to claim 4 wherein said photosensitive member takes the form of an endless belt or a hollow drum.

6. The copying apparatus according to claim 5 wherein said exposure lamp is disposed between the upper and lower paths of said endless belt or inside said hollow drum for illuminating said recording sheet and said endless belt or said hollow drum.

7. The copying apparatus in accordance with claim 1 wherein said recording medium comprises a sheet-shaped supporting member and a plurality of microcapsules coated on one surface of said supporting member, each of said microcapsules enveloping therein a first component which reacts with a second component to change color and each of said microcapsules varying its rupture strength when exposed to ligth of said second wavelength.

8. The copying apparatus in accordance with claim 4 wherein said recording medium comprises a sheet-shaped supporting member and a plurality of microcapsules coated on one surface of said supporting member, each of said microcapsules enveloping therein a first component which reacts with a second component to change color and each of said microcapsules varying its rupture strength when exposed to light of said second wavelength.

9. The copying apparatus according to claim 4 which further comprising developing means that applies pressure to said recording sheet after it has been exposed to light.

10. The copying apparatus according to claim 4 wherein said photosensitive member is made of a mixture of a first photochromic substance which changes from a cyan color to transparent state when exposed to red light, a second photochromic substance which changes from magenta color to a colorless transparent state when exposed to green color light, and a third photochromic substance which changes from yellow color to a colorless transparent state when exposed to blue light.

11. The copying apparatus according to claim 10 which further comprises a color analyzing filter disposed between said photosensitive member and means for projecting a photo-image of a manuscript upon said photosensitive member.

12. The copying apparatus according to claim 10 wherein said exposure lamp comprises an yellow exposure lamp, a magenta exposure lamp and a cyan exposure lamp.

13. Copying apparatus comprising:
   a transparent photosensitive member;
   a first light source emitting light sensible by said photosensitive member;
   first exposure means for forming an image of a manuscript on said transparent photosensitive member by using the light emitted by said first light source;
   means for coating light shielding substance on the exposed photosensitive member corresponding to the image of said manuscript;
   a second light source emitting light not sensed by said transparent photosensitive member;
   second exposure means for projecting the light of said second light source on a photosensitive recording sheet through said transparent photosensitive member coated with said light shielding substance; and
   means for fixing an image on said photosensitive recording sheet.

14. The copying apparatus according to claim 13 wherein said transparent photosensitive member takes the form of a hollow drum, said light shielding substance comprises a toner and said second light source is disposed inside said hollow cylinder.

15. The copying apparatus according to claim 14 wherein said hollow drum is made of transparent material and coated with transparent photosensitive material.

16. The copying apparatus according to claim 13 wherein said recording sheet comprises a paper sheet, microcapsules enveloping therein a dye precursor, a photo-curable resin and a photo-polymerizing initiator, and a layer of a chromogenic material interposed between said paper sheet and said microcapsules, and wherein said chromogenic material reacts with said dye precursor for developing color.

17. The copying apparatus according to claim 13 wherein said recording sheet comprises a transparent film, microcapsules enveloping therein a dye precursor and a photo-softenable resin, and a layer of chromogenic material interposed between said transparent film and said microcapsules.

18. The copying apparatus according to claim 13 wherein said recording sheet comprises a paper sheet, a colored layer coated on said paper sheet, and microcapsules enveloping therein a decolorizing agent and mounted on said colored layer.

19. The copying apparatus according to claim 13 wherein said recording sheet having a layer of microcapsules, and said image fixing means is means for selectively rupturing said microcapsules whose mechanical strength is low.

* * * * *